United States Patent
Pan et al.

(10) Patent No.: US 7,345,307 B2
(45) Date of Patent: Mar. 18, 2008

(54) FULLY INTEGRATED ORGANIC LAYERED PROCESSES FOR MAKING PLASTIC ELECTRONICS BASED ON CONDUCTIVE POLYMERS AND SEMICONDUCTOR NANOWIRES

(75) Inventors: Yaoling Pan, Union City, CA (US); Francisco Leon, Palo Alto, CA (US); David P. Stumbo, Belmont, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

(21) Appl. No.: 11/233,503

(22) Filed: Sep. 22, 2005

(65) Prior Publication Data

US 2006/0214156 A1 Sep. 28, 2006

Related U.S. Application Data

(60) Provisional application No. 60/617,830, filed on Oct. 12, 2004.

(51) Int. Cl.
*H01L 29/10* (2006.01)

(52) U.S. Cl. ............... 257/57; 257/40; 257/72; 257/347; 257/E21.007; 977/762; 977/763; 977/764

(58) Field of Classification Search ........... 257/40, 257/347, E51.005, E51.006, E51.04, E29.242, 257/E29.245, 57, 72, E51.007; 977/936–938, 977/762, 763, 764

See application file for complete search history.

(56) References Cited

U.S. PATENT DOCUMENTS

| 5,920,078 | A | 7/1999 | Frey |
| 5,962,863 | A | 10/1999 | Russell et al. |
| 6,256,767 | B1 | 7/2001 | Kuekes et al. |
| 6,274,007 | B1 | 8/2001 | Smirnov et al. |

(Continued)

FOREIGN PATENT DOCUMENTS

| WO | WO-0103208 | 1/2001 |
| WO | WO-0217362 | 2/2002 |
| WO | WO-0248701 | 6/2002 |

OTHER PUBLICATIONS

Chung, S-W et al., "Silicon nanowire devices" Am. Inst. Phys. (2000) 76(15):2068-2070.

(Continued)

*Primary Examiner*—Minhloan Tran
*Assistant Examiner*—Benjamin Tzu-Hung Liu
(74) *Attorney, Agent, or Firm*—Andrew L. Filler

(57) ABSTRACT

The present invention is directed to thin film transistors using nanowires (or other nanostructures such as nanoribbons, nanotubes and the like) incorporated in and/or disposed proximal to conductive polymer layer(s), and production scalable methods to produce such transistors. In particular, a composite material comprising a conductive polymeric material such as polyaniline (PANI) or polypyrrole (PPY) and one or more nanowires incorporated therein is disclosed. Several nanowire-TFT fabrication methods are also provided which in one exemplary embodiment includes providing a device substrate; depositing a first conductive polymer material layer on the device substrate; defining one or more gate contact regions in the conductive polymer layer; depositing a plurality of nanowires over the conductive polymer layer at a sufficient density of nanowires to achieve an operational current level; depositing a second conductive polymer material layer on the plurality of nanowires; and forming source and drain contact regions in the second conductive polymer material layer to thereby provide electrical connectivity to the plurality of nanowires, whereby the nanowires form a channel having a length between respective ones of the source and drain regions.

5 Claims, 6 Drawing Sheets

U.S. PATENT DOCUMENTS

| | | |
|---|---|---|
| 6,438,025 B1 | 8/2002 | Skarupo |
| 6,447,663 B1 | 9/2002 | Lee et al. |
| 6,465,813 B2 | 10/2002 | Ihm |
| 6,566,704 B2 | 5/2003 | Choi et al. |
| 6,586,785 B2 | 7/2003 | Flagan et al. |
| 6,672,925 B2 | 1/2004 | Talin et al. |
| 6,706,566 B2 | 3/2004 | Avouris et al. |
| 6,760,245 B2 | 7/2004 | Eaton et al. |
| 6,790,425 B1 | 9/2004 | Smalley et al. |
| 6,798,000 B2 | 9/2004 | Luyken et al. |
| 6,815,218 B1 | 11/2004 | Jacobson et al. |
| 6,872,645 B2 | 3/2005 | Duan et al. |
| 6,882,051 B2 | 4/2005 | Majumdar et al. |
| 6,903,717 B2 | 6/2005 | Takahashi et al. |
| 2002/0117659 A1 | 8/2002 | Lieber et al. |
| 2002/0127495 A1 | 9/2002 | Scherer |
| 2002/0130311 A1 | 9/2002 | Lieber et al. |
| 2002/0130353 A1 | 9/2002 | Lieber et al. |
| 2002/0163079 A1 | 11/2002 | Awano |
| 2002/0173083 A1 | 11/2002 | Avouris et al. |
| 2002/0175408 A1 | 11/2002 | Majumdar et al. |
| 2003/0012723 A1 | 1/2003 | Clarke |
| 2003/0042562 A1 | 3/2003 | Giebeler et al. |
| 2003/0089899 A1 | 5/2003 | Lieber et al. |
| 2003/0186522 A1 | 10/2003 | Duan et al. |
| 2003/0189202 A1 | 10/2003 | Li et al. |
| 2004/0005258 A1 | 1/2004 | Fonash et al. |
| 2004/0031975 A1 | 2/2004 | Kern et al. |
| 2004/0036126 A1 | 2/2004 | Chau et al. |
| 2004/0036128 A1 | 2/2004 | Zhang et al. |
| 2004/0061422 A1 | 4/2004 | Avouris et al. |
| 2004/0095658 A1* | 5/2004 | Buretea et al. ............ 359/853 |
| 2004/0112964 A1* | 6/2004 | Empedocles et al. ....... 235/491 |
| 2004/0213307 A1 | 10/2004 | Lieber et al. |
| 2004/0238887 A1 | 12/2004 | Nihey |
| 2005/0064618 A1 | 3/2005 | Brown et al. |
| 2005/0184641 A1* | 8/2005 | Armitage et al. .......... 313/495 |

OTHER PUBLICATIONS

Duan, X. et al., "High performance thin-film transistors using semiconductor nanowires and nanoribbons" Nature (2003) 425:274-278.

Tans, S.J. et al., "Room-temperature transistor based on a single carbon nanotube" Nature (1998) 393:49-52.

Yamada, T. "Analysis of submicron carbon nanotube field-effect transistors" Appl. Phys Letts (2000) 76(5):628-630.

* cited by examiner

FULLY INTEGRATED ORGANIC LAYERED PROCESSES FOR MAKING PLASTIC ELECTRONICS BASED ON CONDUCTIVE POLYMERS AND SEMICONDUCTOR NANOWIRES

CROSS-REFERENCE TO RELATED APPLICATIONS

This application claims priority to U.S. Provisional Patent Application No. 60/617,830, filed Oct. 12, 2004, the entirety of which is incorporated herein.

STATEMENT REGARDING FEDERALLY SPONSORED RESEARCH

Not applicable.

BACKGROUND OF THE INVENTION

The present invention relates to semiconductor devices, and more particularly, to the fabrication and use of novel electronic devices made using conductive polymer materials having nanowires (or other nanostructures) incorporated therein and/or thereon.

The advancement of electronics has been moving towards two extremes in terms of physical scale. Rapid miniaturization of microelectronics according to Moore's law has led to remarkable increases in computing power while at the same time enabling reductions in cost. In parallel, extraordinary progress has been made in the other, relatively less noticed, area of macroelectronics, where electronic devices are integrated over large area substrates with sizes measured in square meters. Current macroelectronics are primarily based on amorphous silicon (a-Si) or polycrystalline silicon (p-Si) thin film transistors (TFTs) on glass, and are finding important applications in areas, including flat panel display (FPD), solar cells, smart cards, radiofrequency identification tags, image sensor arrays and digital x-ray imagers.

While the current technology is successful in many perspectives, it is limited in what applications it can address. For example, there has been growing interest in the use of plastic as the substrate for macroelectronics due to plastic's light weight, flexibility, shock resistance and low cost. However, the fabrication of high performance TFTs on plastics has been extremely challenging because all process steps must be carried out below the glass transition temperature of the plastic. Significant efforts have been devoted to search for new materials (such as organics and organic-inorganic hybrids) or new fabrication strategies suitable for TFTs on plastics, but only with limited success. Organic TFT's promise the potential of roll-to-roll fabrication process on plastic substrates, but with only a limited carrier mobility of about <1 $cm^2/V \cdot s$ The limitations posed by materials and/or substrate process temperature (particularly on plastic) lead to low device performance, restricting devices to low-frequency applications. Therefore, applications that require even modest computation, control, or communication functions cannot be addressed by the existing TFT technology.

Individual semiconductor nanowires (NWs) and single walled carbon nanotubes can be used to fabricate nanoscale field effect transistors (FETs) with electronic performance comparable to and in some case exceeding that of the highest-quality single-crystal materials. In particular, carrier mobility of 300 $cm^2/V \cdot s$ has been demonstrated for p-Si NWs, 2000-4000 $cm^2/V \cdot s$ for n-indium InP NWs and up to 20,000 $cm^2/V \cdot s$ for single walled carbon nanotubes. These nanoFETs promise to push Moore's law to the ultimate limit—molecular level—with unprecedented performance. They are, however, currently hard to implement for production-scale nanoelectronics due to the complicated and limited scalability of the device fabrication processes.

What are needed are high performance TFTs that can be applied to plastics and other substrates requiring low process temperatures. What is also needed is a production scalable method for fabrication of nanoscale semiconductor devices than can be used as high performance TFTs on plastics and other substrates requiring low-process temperatures.

BRIEF SUMMARY OF THE INVENTION

The present invention is directed to thin film transistors using nanowires, nanoribbons or other suitable nanostructures (e.g., nanorods, nanotubes and the like), and production scalable methods to produce such transistors using conductive polymer materials (e.g., polyaniline (PANI) or polypyrrole (PPY)) useful in the production of macroelectronics. In particular, an entirely new concept of macroelectronics has been developed by using oriented semiconductor nanowires, nanoribbons etc. incorporated in, on or within conductive polymer films to produce thin film transistors (TFTs) having high carrier mobility, with the conducting channel parallel to the wire/ribbon axis. Conducting polymers are particularly appealing for macroelectronic applications using nanostructures such as nanowires because they exhibit electrical, magnetic and optical properties similar to metals or semiconductors, while retaining their flexibility, ease of processing, and modifiable electrical conductivity. The electrical conductivity of these polymers can vary from an insulator to almost the metallic state and can be reversibly modulated over 10 to 15 orders of magnitude by controlling the dopant type and level. The conductive polymers can also be patterned simply, e.g., by exposing the polymer to light energy (e.g., such as deep ultraviolet light energy) such that device features (e.g., gate, source and/or drain contact regions) on large area substrates (e.g., plastic substrates) may be patterned at relatively low cost.

A NW-TFT fabrication method is also provided in which the high-temperature active semiconductor materials synthesis process, that is creating the NWs or nanoribbons, is carried out before application of the active semiconductor materials to the device substrate. Subsequently, the NW-TFTs are incorporated into (or onto) conductive polymer films and applied to the device substrate via a solution assembly process or other methods like mechanic shearing, spin coating, deposition, etc. All of the electrodes and interconnects can be patterned, for example, simply by exposing the conductive polymer film(s) to deep ultraviolet light. The conducting path for all electrical interconnections as well as electrical insulation can be formed on the same substrate layer. All fabrication processes are additive, which is important for, e.g., roll to roll processing with plastic substrates. As a result, all the nanowires (or other nanostructure elements) in and/or on the conductive polymer film(s) are conformally contacted, which allows stacked wires to improve the current drive capability to create high current mobilities. Embodiments of NW-TFTs as described herein can be potentially deposited from solution onto large area substrates with low-cost, low-temperature processes including micro-contact, ink-jet printing technology and/or roll-to-roll processing techniques, for example.

Therefore, the present invention provides a facile technique for fabrication of transistor devices incorporating nanowire, nanoribbon, nanotube etc. conductive polymer thin films, which opens an entirely new paradigm for electronics, enabling a variety of new capabilities including, moving microelectronics from single crystal substrates to plastic substrates, integrating macroelectronics, microelectronics and potentially nanoelectronics at the device level, and integrating different semiconductor materials on a single substrate. This can impact a broad range of existing applications from flat-panel displays to image sensor arrays, and enable a whole new range of universal flexible, wearable, disposable electronics for computing, storage or communication.

In a first exemplary embodiment of the present invention, a composite material comprising a conductive polymeric material and one or more nanowires incorporated therein is disclosed. The composite material may be deposited on a device substrate using a variety of deposition techniques including, for example, spin coating, casting, printing, wire roding, spraying, dynamic brush-painting etc. The electrical properties of the conductive polymer material can be reversibly changed over the full range of conductivity from insulators to metallic conductors (e.g., the resistivity of the conductive polymer material can be increased by a magnitude of 10× or more, e.g., about 15× or more), e.g., simply by exposing the conductive polymer to light energy such as deep ultraviolet light energy. The conductive polymer may include polymeric material selected from the group comprising polyacytelenes, polydiacytelenes, polyaniline (PANI), polypyrrole (PPY), polythiophenes, poly(phenylquinoline) and other types of conductive polymers including polyphenylene vinylene (PPV), polyfluorenes, polyphenylene sulfide (PPS), polynaphthalene and the like. The conductive polymer may be undoped or doped with either the addition of acceptor or p-doping agents (e.g., AsF5, Br2, I2, HClO4, etc.), or the addition of donor or n-doping agents such as by dipping the conductive polymer in THF solution of alkali metal naphthalide or by electrochemical methods. The conductive polymer can be used neat, or as blends and compounds with other conductive polymers or with commodity polymers such as polyethylene, polypropylene, polystyrene, soft PVC, poly-(methylmetacrylate), phenol-formaldehyde resins, melamineformaldehyde resins, epoxies, and thermoplastic elastomers. The composite material, following deposition on a device substrate, may be patterned (e.g., upon exposure to light energy such as ultraviolet light energy) to form gate, source, and/or drain contact regions to provide transistor structures for new LED, laser, waveguide, or LCD backplane devices incorporating the composite material. Conductive materials such as metals, doped semiconductors, or conductive polymers optionally may be deposited into or onto the gate, drain, and/or source contact regions, e.g., to improve the ohmic contact between the source and drain regions and the nanowires and/or to form a gate contact electrode in the gate contact region.

In another exemplary embodiment of the invention, a NW-TFT device is disclosed which generally comprises a substrate; a conductive polymer layer deposited on the substrate, the conductive polymer layer including a plurality of nanowires at a sufficient density of nanowires to achieve an operational current level; a source and drain contact region defined in the conductive polymer layer; and a gate contact formed over the conductive polymer layer. The plurality of nanowires may be oriented substantially parallel to their long axis, or may be unaligned (e.g., randomly oriented). The nanowires may comprise a layer of oxide deposited on at least a portion of the nanowires. The oxide layer at the ends of the nanowires may be removed (e.g., by etching or laser ablation) to improve ohmic contact between the nanowires and the source and drain contact regions. A conductive material such as a metal or doped silicon may optionally be deposited in the gate, source and/or drain contact regions, e.g., to improve ohmic contact to the nanowires. The nanowires may be formed as a monolayer film, a sub monolayer film, or a multi-layer film. The device substrate may be made from a variety of materials including low-temperature materials such as glass or plastics.

In another embodiment of the invention, a process for making a transistor device is disclosed which generally comprises: providing a device substrate; depositing a first conductive polymer layer on the device substrate; defining one or more gate contact regions in the conductive polymer layer; depositing a plurality of nanowires over the conductive polymer layer at a sufficient density of nanowires to achieve an operational current level; depositing a second conductive polymer layer on the plurality of nanowires; and forming source and drain contact regions in the second conductive polymer layer to thereby provide electrical connectivity to the plurality of nanowires, whereby the nanowires form a channel having a length between respective ones of the source and drain regions. The process may comprise, for example, aligning the nanowires substantially parallel to their long axis. The step of defining one or more gate contact regions may comprise, for example, masking one or more portions of the first conductive polymer layer, and exposing the unmasked portions to ultraviolet light energy to render the unmasked portions highly resistive. The process may further comprise forming a gate dielectric layer on the first conductive polymer layer, wherein the plurality of nanowires are then deposited on the gate dielectric layer. The step of defining the source and drain contact regions in the second conductive polymer layer may comprise, for example, masking at least two or more portions of the second conductive polymer layer, and exposing the unmasked portions to ultraviolet light energy to render the unmasked portions highly resistive. The step of depositing the first and/or second conductive polymer layers may comprise, for example, using a process selected from spin coating, casting, printing (e.g., ink-jet printing), wire roding, spraying, or brush-painting. A conductive material such as a metal or doped silicon may optionally be deposited in the source and drain contact regions to improve ohmic contact to the nanowires.

In another embodiment of the invention, a process for making a transistor device is disclosed which generally comprises: providing a substrate; depositing a conductive polymer layer incorporating a plurality of nanowires on the substrate; defining source and drain contact regions in the conductive polymer layer to thereby provide electrical connectivity to the plurality of nanowires, whereby the nanowires form a channel having a length between respective ones of the source and drain contact regions; and forming a gate on the conductive polymer layer. The nanowires may be aligned substantially parallel to their long axis. The step of defining the source and drain contact regions may comprise, for example, masking two or more portions of the first conductive polymer layer, and exposing the unmasked portions to ultraviolet light energy to render the unmasked portions highly resistive. The step of depositing the conductive polymer layer may comprise, for example, using a coating process selected from spin coating, casting, printing, wire roding, spraying, or brush-painting. A metal or doped silicon, for example, may optionally be deposited in the source and drain contact regions to improve ohmic contact to the nanowires. The nanowires may comprise a layer of oxide deposited on at least a portion of the nanowires, and the process may further comprise removing (e.g., by etching or laser ablation) a portion of the oxide layer at the ends of the nanowires proximal the source and drain contact regions of the device to improve ohmic contact between the nanowires and the source and drain contact regions. The nanowires may be formed as a monolayer film, a sub monolayer film, or a multi-layer film. The device substrate may be made from a variety of materials including low-temperature materials such as plastics.

In another embodiment of the invention, a process for making a transistor device is disclosed which generally comprises: providing a substrate; depositing a first conductive polymer layer on the substrate; defining one or more gate contact regions in the first conductive polymer layer; depositing a second conductive polymer layer having a plurality of nanowires incorporated therein over the first conductive polymer layer; and forming source and drain contact regions in the second conductive polymer layer to thereby provide electrical connectivity to the plurality of nanowires, whereby the nanowires form a channel having a length between respective ones of the source and drain contact regions. The process may comprise aligning the nanowires substantially parallel to their long axis. The step of defining the gate contact region may comprise, for example, masking one or more portions of the first conductive polymer layer, and exposing the unmasked portions to ultraviolet light energy to render the unmasked portions highly resistive. The step of depositing the first and/or second conductive polymer layers may comprise, for example, using a coating process selected from spin coating, casting, printing, wire roding, spraying, or brush-painting. A conductive material such as a metal or doped silicon may optionally be deposited in the gate, source and/or drain contact regions to improve ohmic contact to the nanowires. The nanowires may comprise a layer of oxide deposited on at least a portion of the nanowires, and the process may further comprise removing a portion of the oxide layer at the ends of the nanowires proximal the source and drain contact regions of the device to improve ohmic contact between the nanowires and the source and drain contact regions.

Further embodiments, features, and advantages of the invention, as well as the structure and operation of the various embodiments of the invention are described in detail below with reference to accompanying drawings.

BRIEF DESCRIPTION OF THE DRAWINGS

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

Figure 1A:
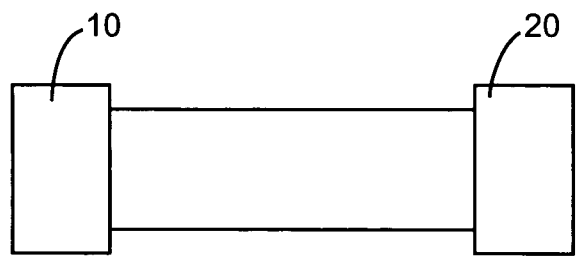
FIG. 1A is a diagram of amorphous or polycrystalline Si TFTs.

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanotube, nanorod, nanowire and nanoribbon technologies and other functional aspects of the systems (and components of the individual operating components of the systems) may not be described in detail herein. Furthermore, for purposes of brevity, the invention is frequently described herein as pertaining to a semiconductor transistor device including nanowires. However, the present invention is not limited to nanowires, and other nanostructures such as nanotubes, nanorods, nanowhiskers, nanoribbons and the like may be used. Moreover, while the number of nanowires and spacing of those nanowires are provided for the specific implementations discussed, the implementations are not intended to be limiting and a wide range of the number of nanowires and spacing can also be used. It should be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and 01/03208, carbon nanotubes, and other elongated conductive or semiconductive structures of like dimensions.

While the example implementations described herein principally use Si, other types of nanowires (and other nanostructures such as nanoribbons, nanotubes, nanorods and the like) can be used including semiconductive nanowires, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2(S, Se, Te)_3$, $Al_2CO$, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

Additionally, the nanowires can include carbon nanotubes, or conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes. Nanotubes can be formed in combinations/thin films of nanotubes as is described herein for nanowires, alone or in combination with nanowires, to provide the properties and advantages described herein.

Furthermore, it is noted that thin film of nanowires of the present invention can be a "heterogeneous" film, which incorporates semiconductor nanowires and/or nanotubes, and/or any combination thereof of different composition and/or structural characteristics. For example, a "heterogeneous film" can includes nanowires/nanotubes with varying diameters and lengths, and nanowires and/or nanotubes that are "heterostructures" having varying characteristics including core-shell nanowire/nanotube structures and nanowires/nanotubes having different compositions along the length of the nanowire/nanotube as is described, for example, in U.S. Pat. No. 6,882,051, the entire contents of which are incorporated by reference herein.

In the context of the invention, although the focus of the detailed description relates to use of nanowire thin films on plastic substrates, the substrate to which nanowires are attached may comprise other materials, including, but not limited to: a uniform substrate, e.g., a wafer of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. In addition, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom", etc.) made herein are for purposes of illustration only, and that devices of the present invention can be spatially arranged in any orientation or manner.

I. Nanowire Thin Film Transistors (NW-TFTs)

Figure 1B:
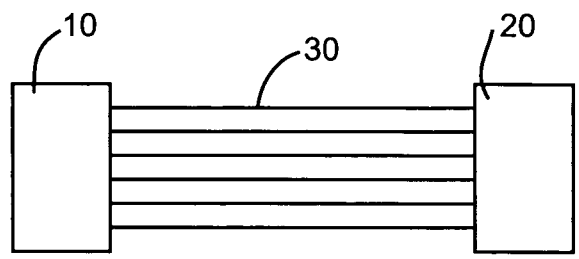
FIG. 1B is a diagram of a NW-TFT, according to an embodiment of the invention.

FIGS. 1A and 1B illustrate the underlying concept for high mobility nanowire TFFs. FIG. 1A represents amorphous or polycrystalline Si TFTs. As can be seen from FIG. 1A, electrical carriers have to travel across multiple grain boundaries resulting in low carrier mobility. Unlike a-Si or poly-Si TFTs in which carriers have to travel across multiple grain boundaries resulting in low mobility, according to an embodiment of the invention, NW-TFTs have conducting channels formed by multiple single crystal NW paths (like a log bridge) in parallel and thus charges travel within single crystals all the way across the source 10 to drain electrode 20 which ensures high carrier mobility. FIG. 1B illustrates an exemplary NW-TFT showing nanowires 30 which span the channel length between source 10 and drain 20 contact regions.

II. NW-TFT Device Fabrication

FIGS. 2A-J illustrate a method for NW-TFT fabrication, according to an embodiment of the invention. The method begins with a device substrate 100 shown in FIG. 2A which can be made from a variety of materials, e.g., including flexible and rigid substrates, and small area and large area substrates, e.g., plastics, ceramics, metals or semimetals, semiconductors, glass, quartz, etc. In the first process step shown in FIG. 2B, a conductive polymer layer 102 is deposited on the substrate 100. The conductive polymer layer may be deposited using a variety of deposition techniques including, for example, spin coating, casting, printing (e.g., ink-jet printing), wire roding, spraying, dynamic brush-painting etc. using techniques such as roll-to-roll processing, for example.

The electrical properties of conductive polymers can be reversibly changed over the full range of conductivity from insulators to metallic conductors, e.g., the resistivity of the conductive polymer material may be increased by an order of magnitude of about 10 or more times, for example, about 15 or more times. For example, the conductive polymer may include a material that is photosensitive such that the resistivity of the material may be altered by photochemical reactions (e.g., by exposing the material to ultraviolet light energy), or the electrical conductivity of the material can be altered by other means such as by physical, chemical or thermal means such as e-beam irradiation, plasma immersion, ion beam irradiation, thermal exposure, etc. The conductive polymer may include polymeric material selected from the group comprising polyacytelenes, polydiacytelenes, polyaniline (PANI), polypyrrole (PPY), polythiophenes, poly(phenyl-quinoline) and other types of conductive polymers including polyphenylene vinylene (PPV), polyfluorenes, polyphenylene sulfide (PPS), polynaphthalene and the like. Currently, polypyrrole and polyaniline are preferred and are the most commonly used conducting polymers because of their relatively superior stability. Polypyrrole may be deposited in film form by electrochemical means. Polyaniline is made soluble through the use of soluble counter-ions that associate with the dopant ions on the polymer backbone. Current commercial applications utilize intermediate conductivity levels of between about $10^{-2}$ and $10^2$ S/cm.

The doping of semiconducting conjugated polymers such as polyaniline and polpyrrole leads to the presence of states in the bandgap (e.g., hopping states) and at sufficient dopant concentrations the band-gap effectively disappears and the polymer acts as a metal with high conductivities. Intrinsic conductivities of materials such as PANI or PPV are on the order of about $10^{-12}$ S/cm; doped conjugated polymers have achieved conductivities of $>10^5$ S/cm, which is close to that of copper. The conductive polymer may be undoped, or doped with either the addition of acceptor or p-doping agents (e.g., $AsF_5$, $Br_2$, $I_2$, $HClO_4$, etc.), or the addition of donor or n-doping agents such as by dipping the conductive polymer in THF solution of alkali metal naphthalide or by electrochemical methods. The conductive polymers can be used neat, or as blends and compounds with other conductive polymers or with commodity polymers such as polyethylene, polypropylene, polystyrene, soft PVC, poly-(methylmetacrylate), phenol-formaldehyde resins, melamineformaldehyde resins, epoxies, and thermoplastic elastomers.

Figure 2A:
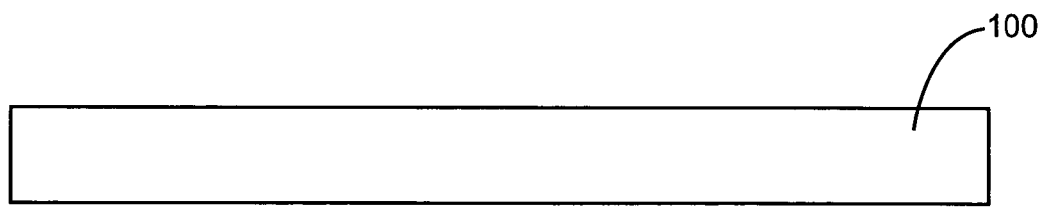
FIG. 2A is schematic of a device substrate used in a method for NW-TFT fabrication, according to an embodiment of the invention.
Figure 2B:
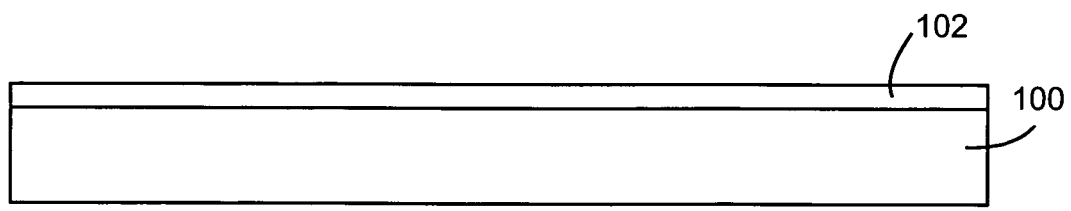
FIG. 2B is a schematic showing deposition of a conductive polymer layer on the device substrate of FIG. 2A.
Figure 2C:
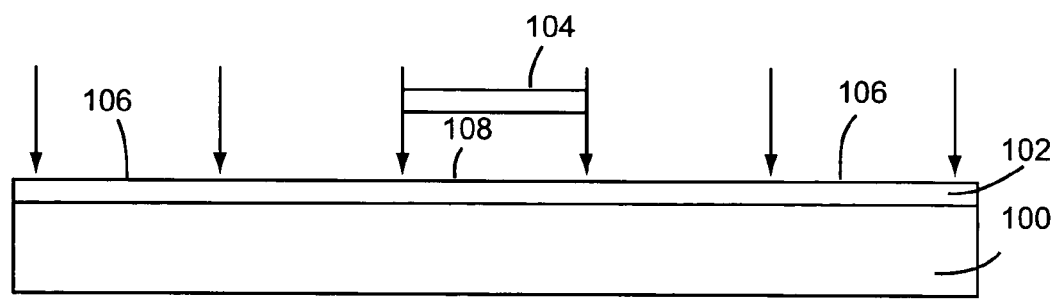
FIG. 2C is a schematic showing patterning of the conductive polymer layer of FIG. 2B and exposure of selected region(s) (e.g., unmasked regions) of the conductive polymer layer to ultraviolet light energy.
Figure 2D:
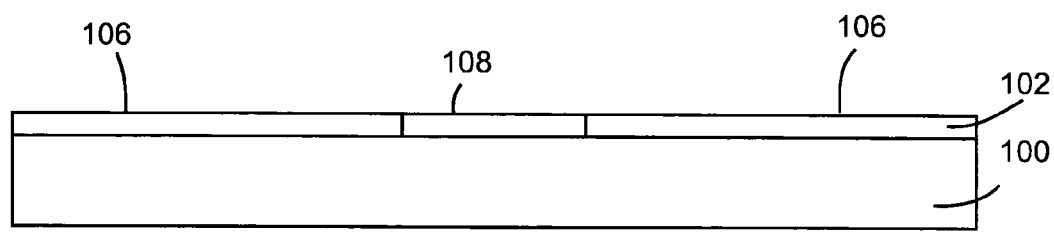
FIG. 2D is a schematic showing formation of a gate contact region in the conductive polymer layer following exposure of the selected region(s) of the conductive polymer layer to ultraviolet light energy.

In the next step of the process shown in FIGS. 2C-D, the conductive polymer layer is patterned using a gate mask 104 to mask selected portions of the conductive polymer layer, while exposing other portions that are subject to ultraviolet light energy exposure (shown by the downward directed arrows in FIG. 2C) from an ultraviolet energy source (not shown). The masking process can also be done with energetic electronic beam, ion beam, plasma immersion, or other processes like thermal or chemical means. Those portions 106 of the conductive polymer layer which are exposed to UV light energy or other energy are reduced to a resistive polymer (e.g., the resistivity increases by a factor of about 10 or 15 or more orders of magnitude), while the masked portion(s) 108 of the conductive polymer layer, which serve as the gate contact region, remain substantially conductive (e.g., Rs is approximately on the order of between about $10^{-2}$ to about $10^2$ S/cm for PANI). Optionally, a conductive material such as a metal, a doped semiconductor, or a conductive polymer can be formed (e.g., deposited) in the gate contact region 108 to improve ohmic contact to the nanowires (which are described further below).

Figure 2E:
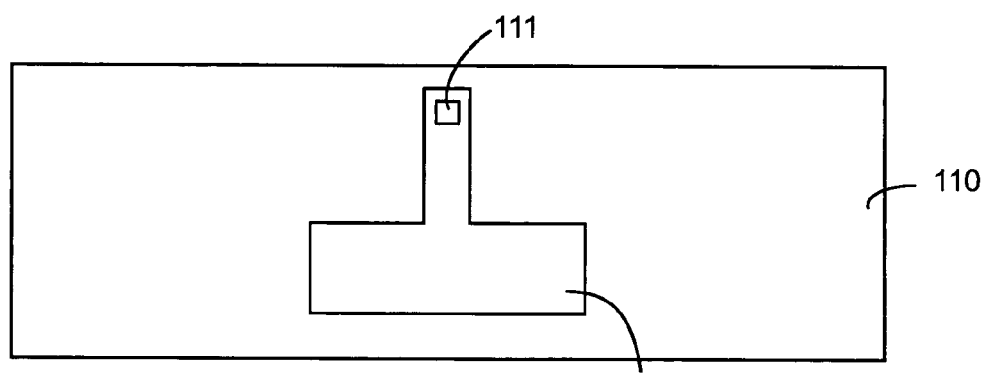
FIG. 2E is a top view of the device substrate and conductive polymer layer of FIG. 2D following deposition of a gate dielectric layer on the conductive polymer layer and formation of a small via through the dielectric layer to the underlying gate contact region.
Figure 2F:
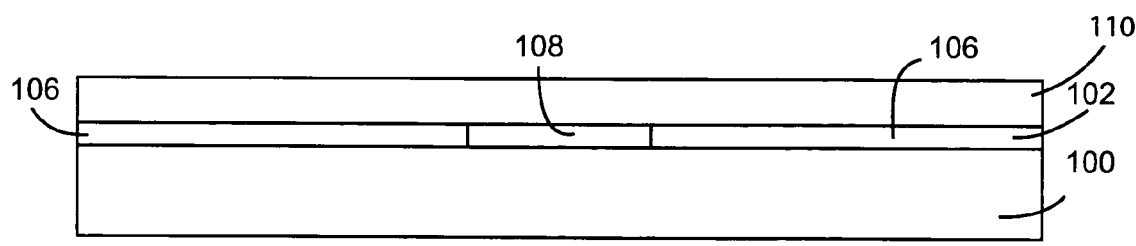
FIG. 2F is a side view of the device substrate, conductive polymer layer and gate dielectric layer of FIG. 2E.
Figure 2G:
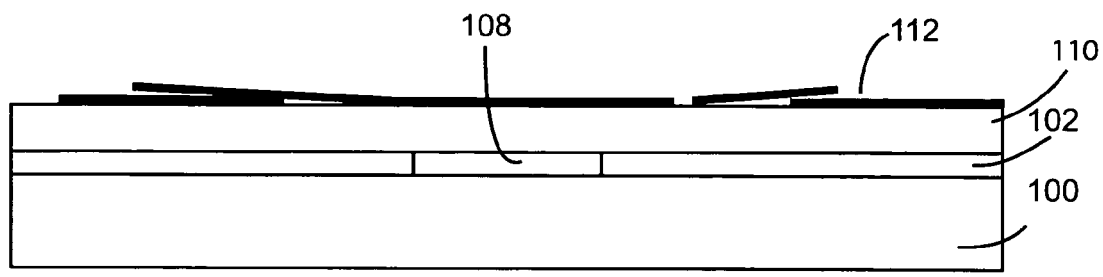
FIG. 2G is a schematic showing deposition of a thin film of nanowires on the gate dielectric layer of FIG. 2F.
Figure 4A:
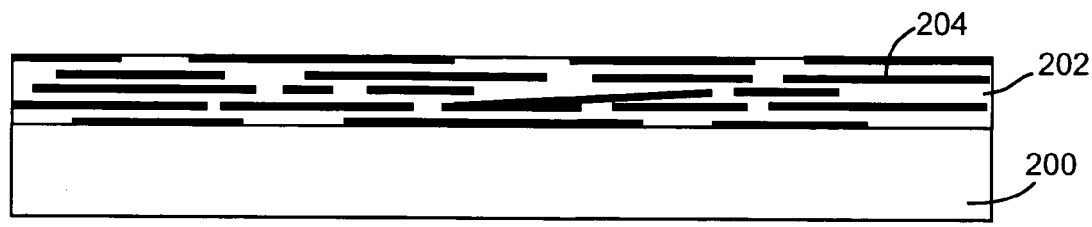
FIG. 4A a schematic of another embodiment of a NW-TFT device made according to the teachings of the present invention in which a composite film including a conductive polymer material having a plurality of nanowires embedded therein is deposited directly on a device substrate to form the active layer of the device.
Figure 4B:
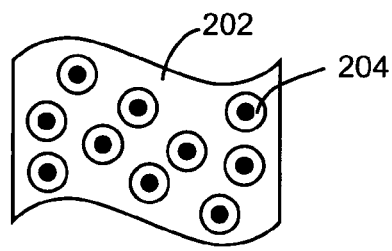
FIG. 4B is a close-up view of a plurality of core-shell nanowires which are incorporated in the composite film layer of FIG. 4A

Subsequently, as shown in FIGS. 2E-F, a dielectric material layer 110 is applied to the conductive polymer layer. Dielectric material layer 110 functions as a gate dielectric, and can be any type of dielectric material, including organic or inorganic materials such as silicon nitride, silicon dioxide, aluminum oxide, an insulating polymer film or the like, and can be spun on, sputtered, or applied in any other manner described or referenced elsewhere herein, or otherwise known, including using ink-jet printing or micro-contact printing methods. In an embodiment, the dielectric material can be recessed in the channel area to give better coupling efficiency in the channel area. In another embodiment, dielectric material layer 110 can be a shell layer of nanowires 112 as described further below in connection with the embodiment of FIGS. 4A-C.

A small via 111 can be formed through the dielectric coating layer 110 to the underlying gate contact region 108 to provide electrical connectivity to the nanowires which are deposited on the dielectric coating layer. The via 111 can be formed by conventional via processing techniques such as etching, laser ablation or photochemical reaction.

Alternatively, the process steps described above in connection with FIGS. 2B-F can be substituted by replacing the first conductive polymer layer 102 with a gate contact or electrode (e.g., made from a metal, semiconductor, metal alloy etc.) which is patterned or formed directly onto the device substrate using standard photolithography and metal deposition methods like e-beam evaporation, sputtering, chemical vapor deposition (CVD) techniques to form a metal or semiconductor gate electrode having a thickness of between about 500 angstroms and 1 micron, for example. The gate electrode can then be coated with a suitable organic or inorganic dielectric layer and a via can be formed through the dielectric using standard via processing techniques such as etching or laser ablation. The remaining process steps can then proceed as described below in connection with the description of FIGS. 2G-J.

Single crystal NWs 112 which have been synthesized on a separate growth substrate are then deposited, e.g., from solution on the dielectric layer 110. In one example, p-type silicon NWs with controlled diameters were synthesized by decomposition of SiH4 and B2H6 using gold colloid particles (available through British Biocell International Ltd.) as the catalyst in a pilot production scale reactor. The growth is typically carried out at a temperature between 420-480 degrees Celsius, with a total pressure of 30 torr, a silane partial pressure of approximately 2 torr, for a period of 40 minutes. The SiH4 and $B_2H_6$ ratio can be varied to control the doping level. For example, A ratio of 6400:1 can be used in synthesizing the NWs. The resulting NWs typically had lengths of 5 um to about 100 um with a nearly monodisperse diameter in the range from about 5 nm to about 100 nm as determined by the Au colloid catalytic particle. As synthesized the NWs have a core shell structure with a single crystalline silicon core surrounded by an amorphous silicon oxide shell of thickness of about 2 nm to about 20 nm.

Figure 5A:
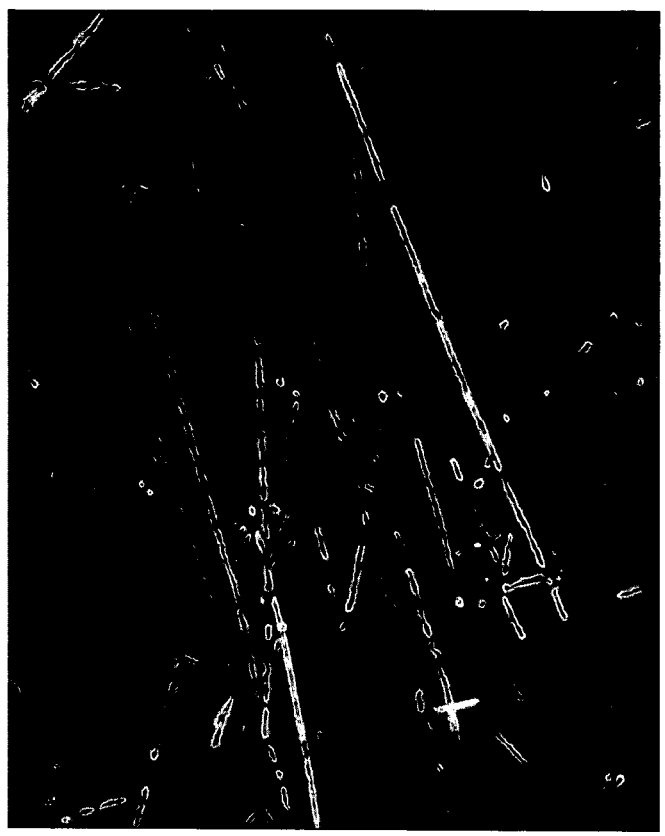
FIG. 5A is an optical micrograph showing nanowires embedded in a conductive polymer film which are coated on a plastic substrate using a wire roding deposition process.
Figure 5B:
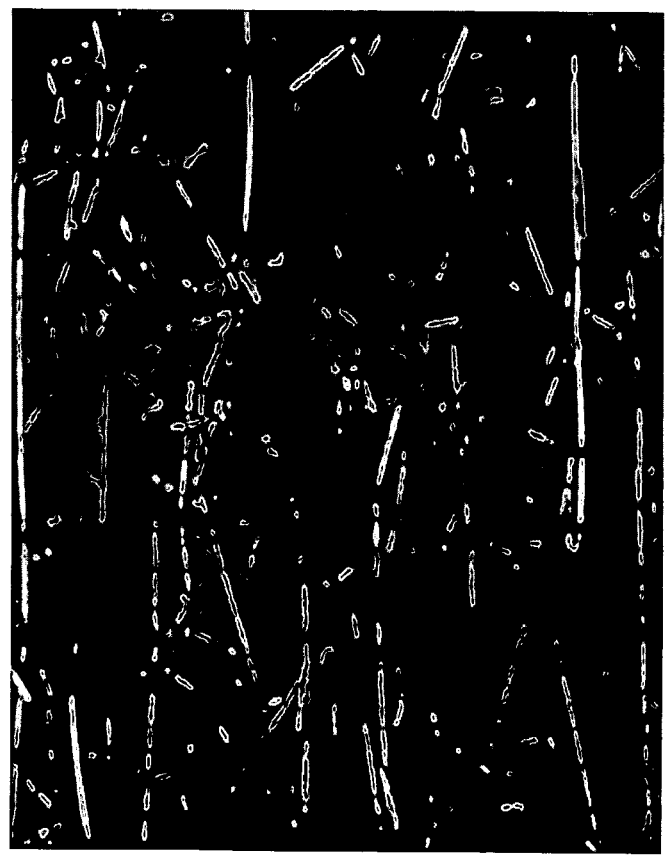
FIG. 5B is an optical micrograph showing nanowires embedded in a conductive polymer film which are coated on a plastic substrate using a dynamic paint brushing deposition process.

The nanowires, after being dispersed into solution (e.g., ethanol), are assembled onto the dielectric coating layer using, for example, a fluidic flow directed alignment method to obtain an oriented NW thin film. The NW suspension is allowed to pass through a fluidic channel structure formed between a poly-dimethlysiloxane (PDMS) mold and a flat substrate surface to obtain NW arrays on the surface. The average NW space in the thin film can be controlled by varying the NW concentration in the solution and/or the total flow time. With this approach, the alignment can be readily extended over a 4-inch wafer or even larger areas by using a longer or larger flow channel mold. The nanowires may also be deposited and aligned/oriented on the dielectric layer by a variety of other means such as are disclosed in Lieber et al. U.S. Patent Application Pub. No. U.S. 2002/0130311, filed Aug. 22, 2001, and in U.S. Pat. No. 6,872,645 the entire contents of which are each incorporated by reference herein. FIG. 5A is an optical micrograph showing nanowires embedded in a conductive polymer film which are coated on a plastic substrate using a wire roding deposition process. FIG. 5B is an optical micrograph showing nanowires embedded in a conductive polymer film which are coated on a plastic substrate using a dynamic paint brushing deposition process.

Figure 2H:
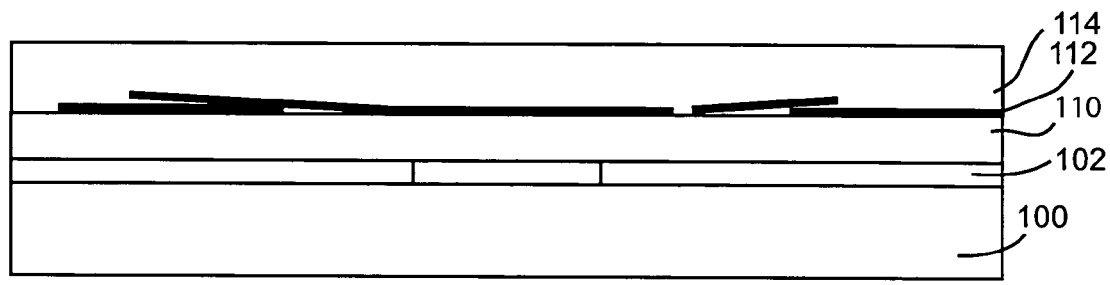
FIG. 2H is a schematic showing deposition of a second conductive polymer layer on the plurality of nanowires of FIG. 2G.
Figure 2I:
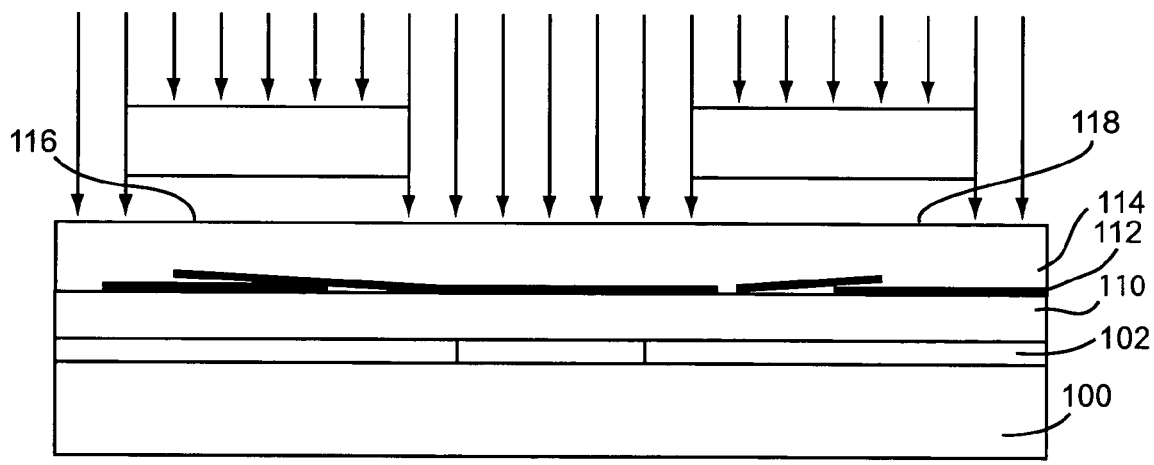
FIG. 2I is a schematic showing formation of a source and drain contact region in the second conductive polymer layer following exposure of selected (unmasked) regions of the second conductive polymer layer to ultraviolet light energy.
Figure 2J:
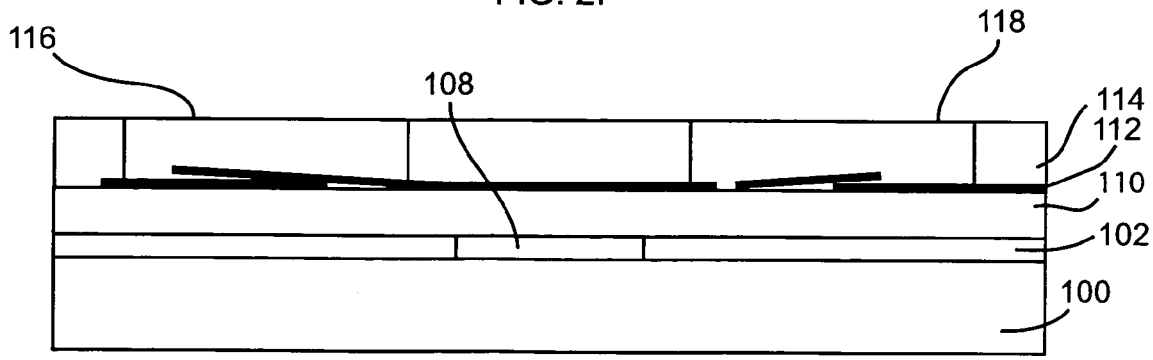
FIG. 2J is a schematic showing the NW-TFT device following formation of source and drain contact regions in the second conductive polymer layer following exposure of the selected regions of the second conductive polymer layer to ultraviolet light energy.

Following nanowire deposition, a second conductive polymer layer 114 is deposited on the nanowires 112 as shown in FIGS. 2H using any of the deposition methods described previously. Next, as shown with respect to FIGS. 2I-J, the second conductive polymer layer 114 is patterned to form source and drain contact regions 116, 118, respectively, in the conductive polymer layer 114 which contact regions are each in contact with at least one or more of nanowires 112. Similar to formation of gate contact region 108 in the first conductive polymer layer 102, selected regions 116, 118 of the second conductive polymer layer where the source and drain contacts are to be formed, are masked and the unexposed portions of the conductive polymer layer are exposed to UV light energy to render them highly resistive. The source and drain contact regions 116, 118 are defined by the masked portions which are shielded from UV light exposure and thus remain conductive. The source and drain regions 116, 118 optionally can then be subjected to standard photolithography or e-beam lithography processes to define metal (e.g., gold (Au)) or semiconductor contact electrodes to yield functional TFTs. Such gate, drain, or source contacts can be painted, electroplated, evaporated, sputtered, spun on, printed (e.g., using ink-jet printing methods) or applied as described or referenced elsewhere herein, or otherwise known. Although the previous embodiment disclosed the formation of a single gate contact, in other embodiments, one or more additional gate contacts, global or local, can be formed in and/or on one or more of the conductive polymer layers to enhance performance. The one or more second gates (not shown) can be coupled to, or isolated from, first gate contact region 108.

Figure 3A:
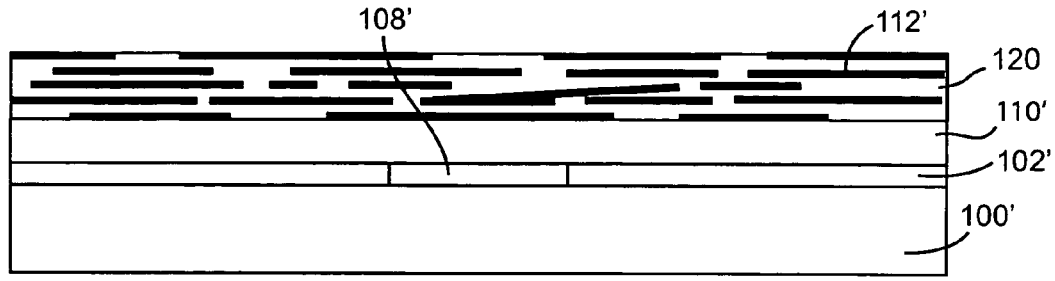
FIG. 3A is a schematic side view of another embodiment of a NW-TFT device made according to the teachings of the present invention in which a composite film including a conductive polymer material having a plurality of nanowires embedded therein is used to form the active layer of the device.
Figure 3B:
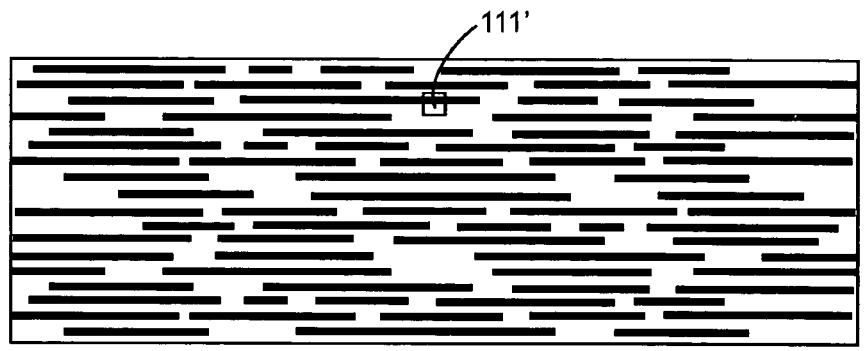
FIG. 3B is a top view of the NW-TFT device of FIG. 3A.
Figure 3C:
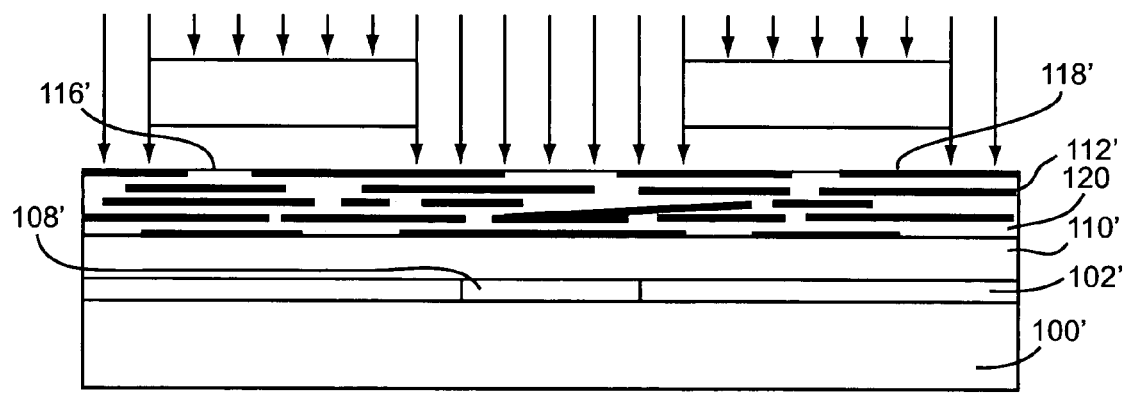
FIG. 3C is a schematic showing formation of a source and drain contact region in the composite film layer of the NW-TFT device of FIG. 3A following exposure of selected (unmasked) regions of the conductive polymer to ultraviolet light energy.
Figure 3D:
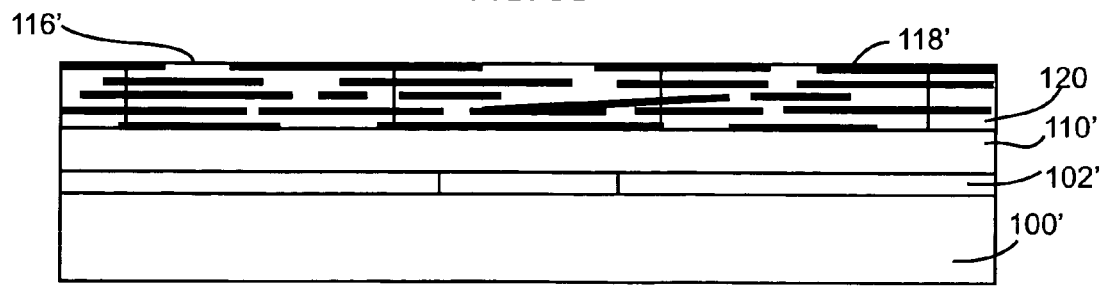
FIG. 3D is schematic showing the NW-TFT device following formation of source and drain contact regions in the composite film layer following exposure of the conductive polymer to ultraviolet light energy.

In an alternative embodiment of the process of NW-TFT fabrication described above, the nanowire deposition step can be modified by incorporating the nanowires into a conductive polymer film as shown with respect to FIGS. 3A-D. The nanowires may be formed as a monolayer film, a sub monolayer film, or a multi-layer film 120 as shown in FIG. 3A. The conductive polymer film 120 having the nanowires incorporated therein is then deposited on a dielectric coating layer 110' which is applied onto the first conductive polymer layer 102'. Subsequently, as shown with respect to FIGS. 3C-D, the second conductive polymer layer having nanowires 112' embedded therein is patterned to form source and drain contact regions 116', 118', respectively, in the conductive polymer layer 120. Similar to formation of gate contact region 108' in the first conductive polymer layer 102', source and drain regions 116', 118' of the second conductive polymer layer 120 are masked and the unexposed portions of the conductive polymer layer are exposed to UV light energy to render them highly resistive. The source and drain contact regions 116', 118' are defined by the masked portions which are shielded from UV light exposure and thus remain conductive.

The performance of NW-TFTs can be further improved in a number of ways by exploiting various NW core-shell structures. For example, a core-shell NW structure consisting of a single crystal semiconductor core and a high quality gate dielectric shell will greatly enhance the quality of interface between Si and oxide to improve the device performance like low leakage, low sub-threshold swing, and high surface carrier mobility, etc. Although Si NWs naturally have a core-shell structure, the thin native oxide layer is not of enough quality to withstand a high electric field. The native oxide can be replaced with a high quality silicon oxide shell generated by either controlled thermal oxidation or chemical vapor deposition. Core-shell NW structures are likely to be ideally suited for making high performance NW-TFTs on plastic since it separates all the high temperature processes, including semiconductor material synthesis and high quality gate dielectric formation, from the final device substrate. In addition, such core-shell structure can also lead to passivation of surface trapping states, resulting in further performance enhancement.

Second, the current back-gated NW-TFTs are relatively limited in performance due to a geometrical effect. Such a geometrical effect can be overcome by developing a more complex NW core-shell structure to include a core of single crystal semiconductor, an inner-shell of gate dielectric, and an outer-shell of conformal gate. This can be realized by depositing a layer of highly-doped amorphous silicon or other metals deposited by CVD or atomic layer deposition (ALD) around the Si/SiOx core-shell structure (described above) as the outer-gate shell.

Third, the performance of NW-TFTs can potentially be further improved to exceed that of single crystal materials by exploiting the quantum electronic effect in small diameter NWs. In analogy to conventional two dimensional semiconductor superlattices and 2D electron/hole gas, multi-coreshell NW structure can be envisioned to separate the dopants from the active conducting channel to achieve ultra-high mobility TFTs.

Figure 4C:
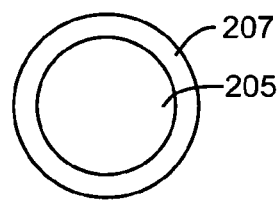
FIG. 4C is a cross-sectional view of a core-shell nanowire of FIG. 4B.
Figure 4D:
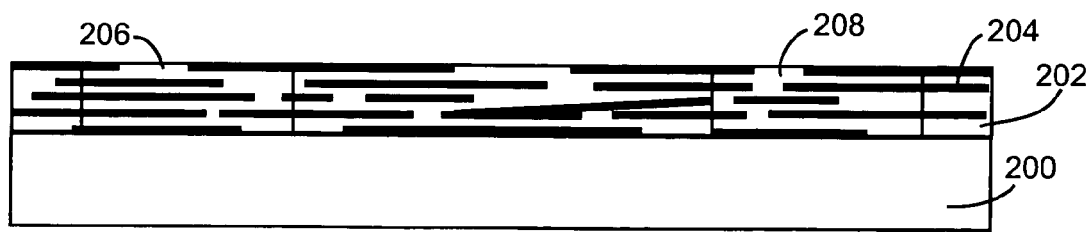
FIG. 4D is schematic showing formation of a source and drain contact region in the composite film layer of the NW-TFT device of FIG. 4A following exposure of selected (unmasked) regions of the conductive polymer to ultraviolet light energy.

FIGS. 4A-D show an alternative embodiment of the invention in which NW-TFT devices are fabricated using nanowire core-shell structures. In this embodiment, a conductive polymer film 202 incorporating a plurality of core-shell nanowires 204 (shown in detail in the schematics of FIG. 4B-C) is deposited on a device substrate 200. The nanowires each comprise a nanowire core 205 made from a semiconductor (or other material, e.g., metal, conductive polymer, ceramic etc.) surrounded by a dielectric shell 207 such as an oxide layer as shown in the cross-sectional view of a single nanowire in FIG. 4C. The conductive polymer layer is then patterned as described previously to form source and drain contact regions 206, 208 respectively in the conductive layer as shown in FIG. 4C. A conformal gate electrode (not shown) can then be formed over the conductive layer above the channel region between the source and drain contacts. The oxide shell covering the ends of the nanowires optionally can be removed proximal both the source and drain contact regions of the device to improve the ohmic contact between the core-shell nanowires and the contact conductor, which can be made of metal, a doped semiconductor, or the conductive polymer material itself. The oxide shell layer can be selectively etched from the nanowires in any manner. If necessary, a photoresist material can be patterned on the nanowires to protect portions of the oxide layer on the nanowires that are not to be removed. A photolithography process can be used, for example. The nanowires can be exposed or treated with an etching source (e.g., chemical etching material, laser light, etc.) to remove unprotected portions of the oxide layer. Any type of suitable material removal process can be used. For example, reactive ion etching or other etching technique can be used. For example, the plasma power, pressure, and/or the substrate bias can be tuned such that the ion beam will be more direct towards the surface.

An important aspect of the as-described NW thin film concept is that the entire NW-TFT fabrication process can be performed essentially at room temperature, except for the NW synthesis step which is separate from the device fabrication. Therefore, the assembly of high performance NW-TFTs can be readily applied to low cost glass and plastic substrates. Note that in embodiments, electronic devices can be formed having any number of one or more nanowires. For example, pluralities of nanowires can be formed into a thin film, and used in electronic devices. When a plurality of nanowires are used, the nanowires can be aligned or non-aligned (e.g., randomly oriented).

II. EXAMPLE APPLICATION

The embodiments described herein, when applied to NW-TFT technology, enable the manufacturing of transistors with performance characteristics comparable or exceeding that of transistors fabricated from traditional single-crystal silicon on very large flexible substrates. This enables ultra-large scale, high-density electrical integration, and provides a true silicon-on-plastic technology. The potential applications of this technology, including military applications, are very broad. The NW-TFT technology described herein enables the development of a variety of unique applications, including RF communications, solar cells, smart cards, radiofrequency identification tags, detectors, sensor arrays, X-ray imagers, flexible displays (e.g., active matrix liquid crystal displays), electronics and more.

For example, incorporating NW-TFTs into Large Area Electronic Reflectors (LAER) enables the electronically morphing of "any" surface into a parabolic antenna for directed high gain RF transmission or reception. This is similar to making a roof top physically shaped to optimally protect a house from water while the electronic shape of the roof top would operate as a very large satellite dish. Convex shapes could be made to be electronically concave and thus increase the efficiency of the transceivers, thus reducing the power required to operate them or increase their life or range. Furthermore, the bladder of an airship (such as a blimp) can be made to operate as a very large morphing antenna aperture. Such an airship is a low cost solution for launching a high altitude electronic surveillance/communicator. Embedded TFTs that operate in RF frequencies on the surface of an airship bladder reduce the weight and increase the performance of the air ship.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed:

1. A transistor device comprising:
   a. a substrate;
   b. a conductive polymer layer deposited on said substrate, said conductive polymer layer including a plurality of nanowires at a sufficient density of nanowires to achieve an operational current level, wherein said plurality of nanowires are oriented substantially parallel to their long axis;
   c. a source and drain region defined in said conductive polymer layer; and
   d. a gate formed over said conductive polymer layer.

2. The device of claim 1, wherein the nanowires comprise a layer of oxide deposited on at least a portion of the nanowires.

3. The device of claim 2, wherein the ends of the nanowires have substantially no oxide layer thereon to improve ohmic contact between the nanowires and the source and drain regions.

4. The device of claim 1, wherein the nanowires are formed as a monolayer film, a sub monolayer film, or a multi-layer film.

5. device of claim 1, wherein the substrate is made from a plastic material.

* * * * *